(12) United States Patent
Pei

(10) Patent No.: US 6,200,153 B1
(45) Date of Patent: Mar. 13, 2001

(54) SOCKET CONNECTOR

(75) Inventor: Wen-Chun Pei, Taipei (TW)

(73) Assignee: Hon Hai Precision Ind. Co., Ltd., Taiepi Hseien (TW)

( * ) Notice: Subject to any disclaimer, the term of this patent is extended or adjusted under 35 U.S.C. 154(b) by 0 days.

(21) Appl. No.: 09/354,698

(22) Filed: Jul. 15, 1999

(30) Foreign Application Priority Data

Dec. 28, 1998 (TW) .................................................. 87221629

(51) Int. Cl.$^7$ .................................................. H01R 11/20
(52) U.S. Cl. .................................................. 439/342; 439/70
(58) Field of Search .................................. 439/342, 70, 71, 439/72, 73, 83, 525, 526, 876

(56) References Cited

U.S. PATENT DOCUMENTS 5,342,207 * 8/1994 Sobhani .................................. 439/74
6,030,238 * 2/2000 Dong .................................. 439/159
6,062,890 * 5/2000 Pei et al. .................................. 439/342

* cited by examiner

Primary Examiner—Gary Paumen
Assistant Examiner—Alexander Gilman
(74) Attorney, Agent, or Firm—Wei Te Chung

(57) ABSTRACT

A socket connector includes a pair of spaced locking blocks fixed to a circuit board. A plurality of contact elements is mounted to the circuit board between the locking blocks. A cover is fixed to the locking blocks and spaced from the circuit board for movably receiving a slide plate therebetween. The cover retains a central processing unit (CPU) module thereon and defines a plurality of holes corresponding to the contact elements through which pins of the CPU module extend. The slide plate defines slots corresponding to the contact elements and the holes of the cover for partially receiving the pins and the contact elements therein whereby when the slide plate is moved to a predetermined position, electrical connection is established between each contact element and the corresponding pin of the CPU module for connecting the CPU module to the circuit board.

9 Claims, 5 Drawing Sheets

SOCKET CONNECTOR

BACKGROUND OF THE INVENTION

1. Field of the Invention

The present invention generally relates to a socket connector, and in particular to a simplified socket connector mounted to a circuit board which replaces a base thereof.

2. The Prior Art

A socket connector, such as Zero Insertion Force (ZIF) connector is often used to connect a central processing unit (CPU) module to a circuit board. As shown in FIG. 1 of the attached drawings, a known socket connector 7 comprises a base 74 fixed on a circuit board (not shown) and a cover 71 mounted to the base 74 with a slide plate 72 movably received therebetween. A manual driving member 73 is pivotally supported between the cover 71 and the base 74 and is drivingly coupled to the slide plate 72 for moving the slide plate 72. The manual driving member 73 partially extends beyond the cover 71 for facilitating manual operation thereof. The rotation of the manual driving member drives the slide plate 72 to move with respect to the base 74 and the cover 71.

Contact elements 75 are received in bores 741 defined in the base 74. The cover 71 defines a plurality of holes 711 corresponding to the contact elements 75 for receiving pins of a CPU module (not shown) therein. The pins are partially received in corresponding slots 721 defined in the slide plate 72 whereby the movement of the slide plate 72 causes conductive members (not shown) retained therein to simultaneously engage with the pins and the contact elements 75.

The contact elements 75 are soldered to the circuit board by a solder ball technique and during the soldering process, heat is simultaneously applied to the base 74 and the circuit board which both undergo thermal expansion. Since the base 74 and the circuit board are often made from different materials having different thermal expansion coefficients, a relative shift occurs between the base 74 and the circuit board causing the solder balls to be undesirably displaced or damaged.

Furthermore, the base 74 shields the engagement between the contact elements 75 and the circuit board whereby it is difficult for a user to inspect and ensure a proper soldering engagement between the contact elements 75 and the circuit board.

Thus, it is desired to have a socket connector that eliminates the problems discussed above.

SUMMARY OF THE INVENTION

Accordingly, an object of the present invention is to provide a socket connector comprising contact elements directly mounted on a circuit board thereby eliminating problems associated with different thermal expansions.

Another object of the present invention is to provide a socket connector having exposed contact elements for facilitating visual inspection of solder joints thereof.

A further object of the present invention is to provide a socket connector having a simple structure.

Still a further object of the present invention is to provide a socket connector having a low manufacturing cost.

To achieve the above objects, an electrical connector in accordance with the present invention comprises a pair of spaced locking blocks fixed to a circuit board. A plurality of contact elements is mounted to the circuit board between the locking blocks. A cover is fixed to the locking blocks and spaced from the circuit board for movably receiving a slide plate therebetween. The cover retains a CPU module thereon and defines a plurality of holes corresponding to the contact elements through which pins of the CPU module extend. The slide plate defines slots corresponding to the contact elements and the holes of the cover for partially receiving the pins and the contact elements therein whereby when the slide plate is moved to a predetermined position, electrical connection is established between each contact element and the corresponding pin of the CPU module for connecting the CPU module to the circuit board.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
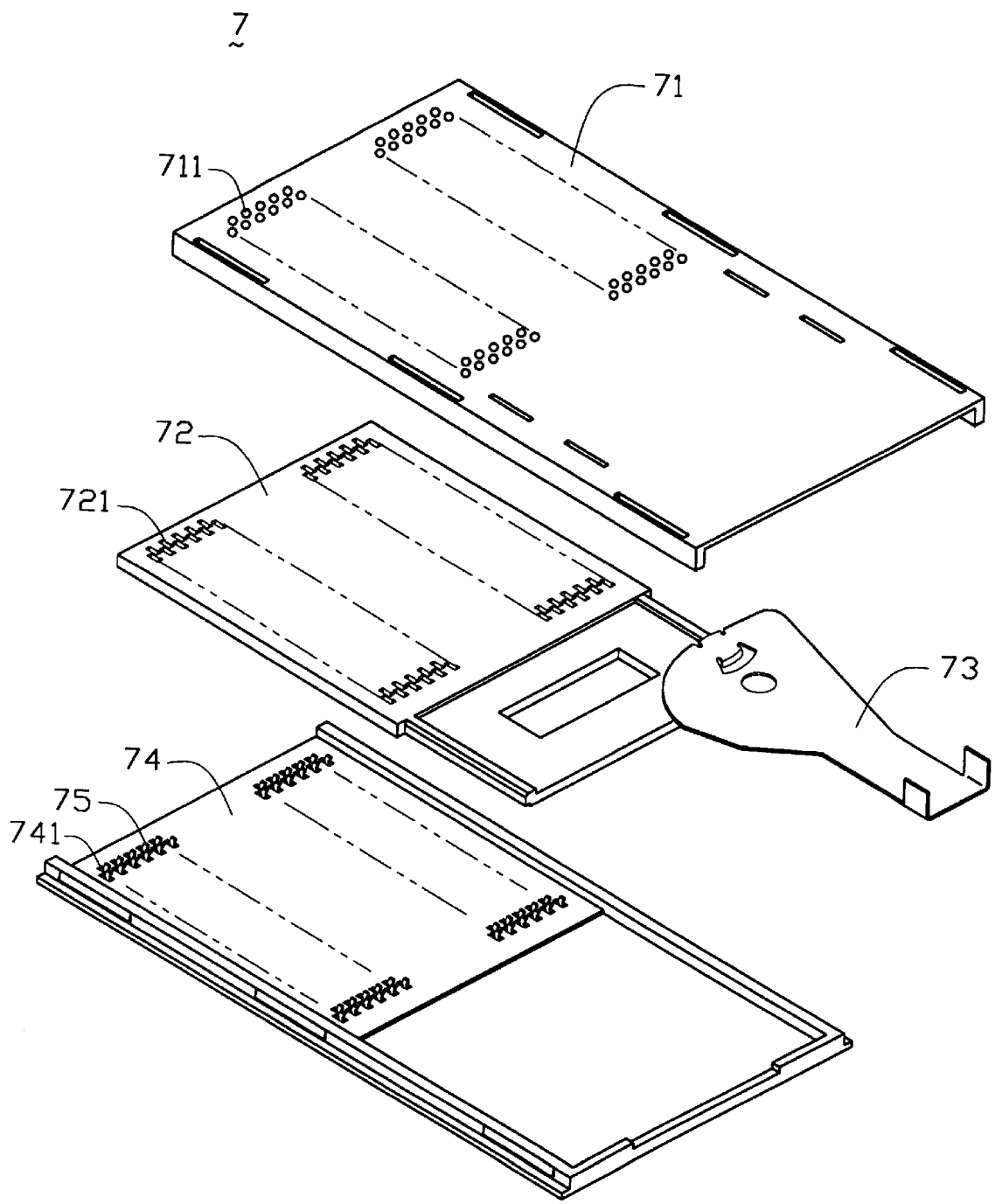
FIG. 1 is an exploded view of a conventional socket connector.
Figure 2:
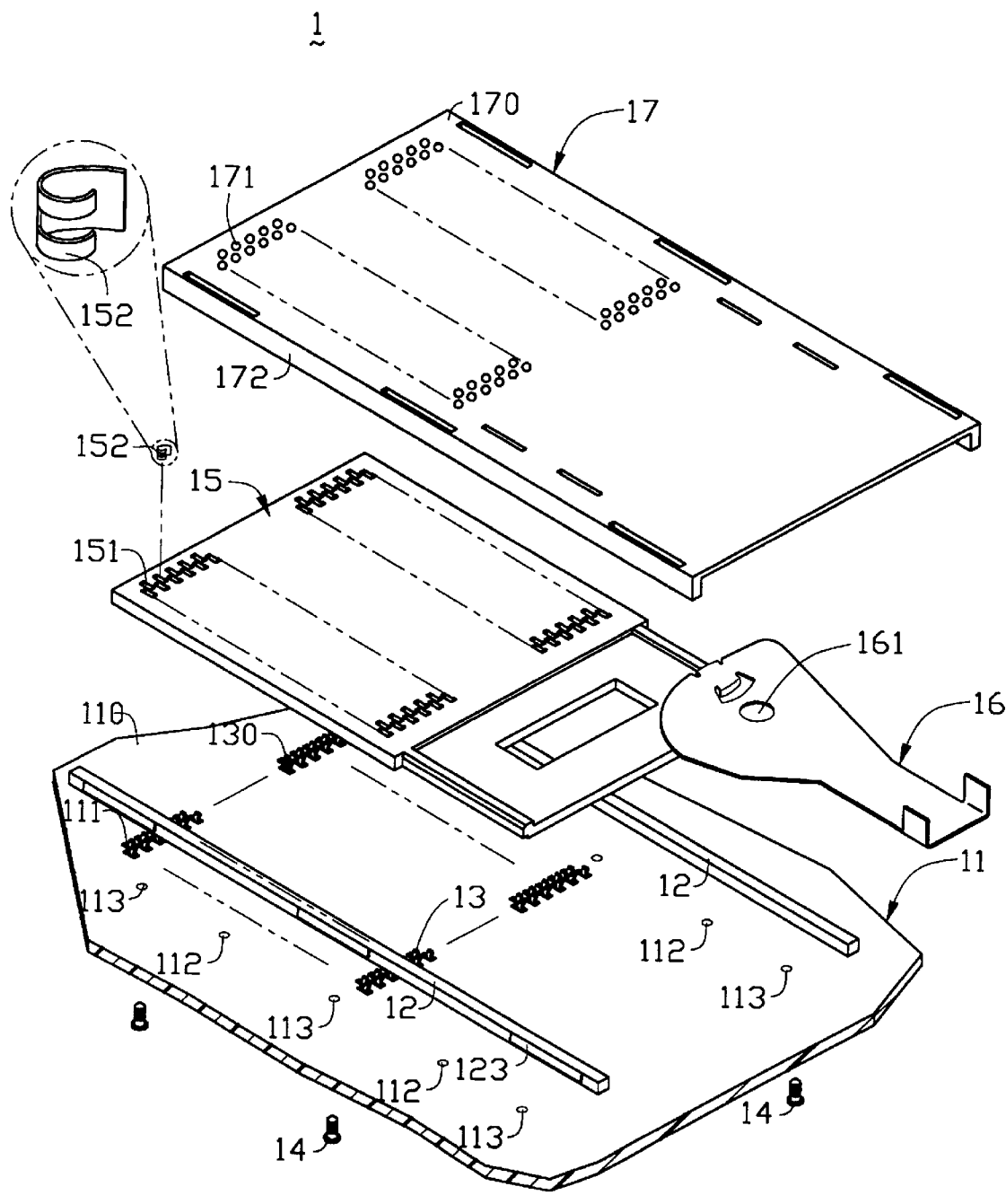
FIG. 2 is an exploded view of a socket connector in accordance with the present invention to be mounted on a circuit board.

Referring to the drawings and in particular to FIG. 2, a socket connector 1 in accordance with the present invention comprises two spaced locking blocks 12 adapted to be mounted to a circuit board 11, and a cover 17 fixed to the locking blocks 12 and spaced from the circuit board 11 for movably receiving a slide plate 15 therebetween. The cover 17 is adapted to support and retain an electronic device (not shown), such as a central processing unit (CPU) module thereon, for establishing electrical connection between the CPU module and the circuit board 11.

Figure 4:
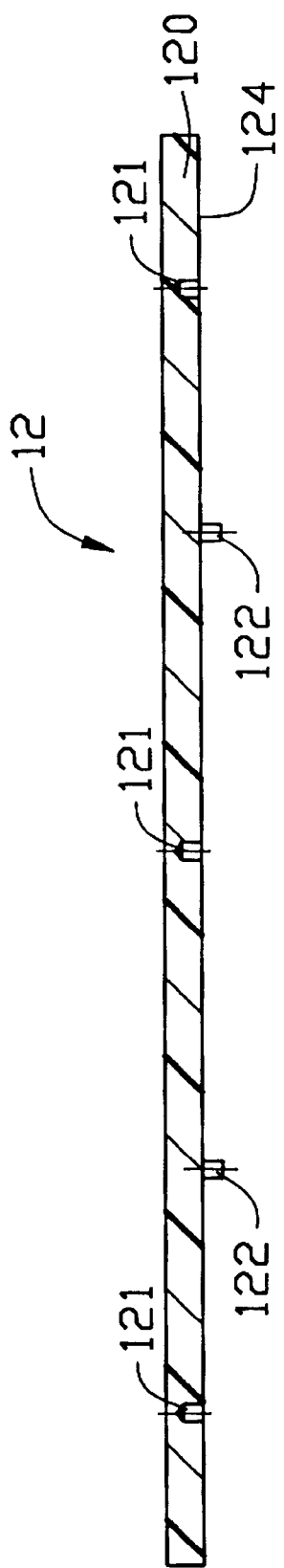
FIG. 4 is a cross-sectional view of the locking block.

Also referring to FIG. 4, each locking block 12 comprises an elongate body 120 having a plurality of positioning pins 122 and securing holes 121 formed on a bottom face 124 thereof. In the embodiment illustrated, two positioning pins 122 and three securing holes 121 are alternately formed on the bottom face 124 of the locking block 12. The positioning pins 122 of each locking block 12 are received in corresponding holes 112 defined in the circuit board 11 for properly positioning the locking block 12 on the circuit board 11. Through holes 113 are defined in the circuit board 11 corresponding to the securing holes 121 of the locking block 12 for the extension of fasteners 14 therethrough to engage with the securing holes 121 of the locking block 12 thereby securing the locking block 12 on the circuit board 11.

The securing holes 121 may be inner-threaded and the fasteners 14 may be bolts for threadingly engaging with the inner-threaded holes 121. Preferably, the fasteners 14 are made of an insulative material, such as plastic.

Figure 3:
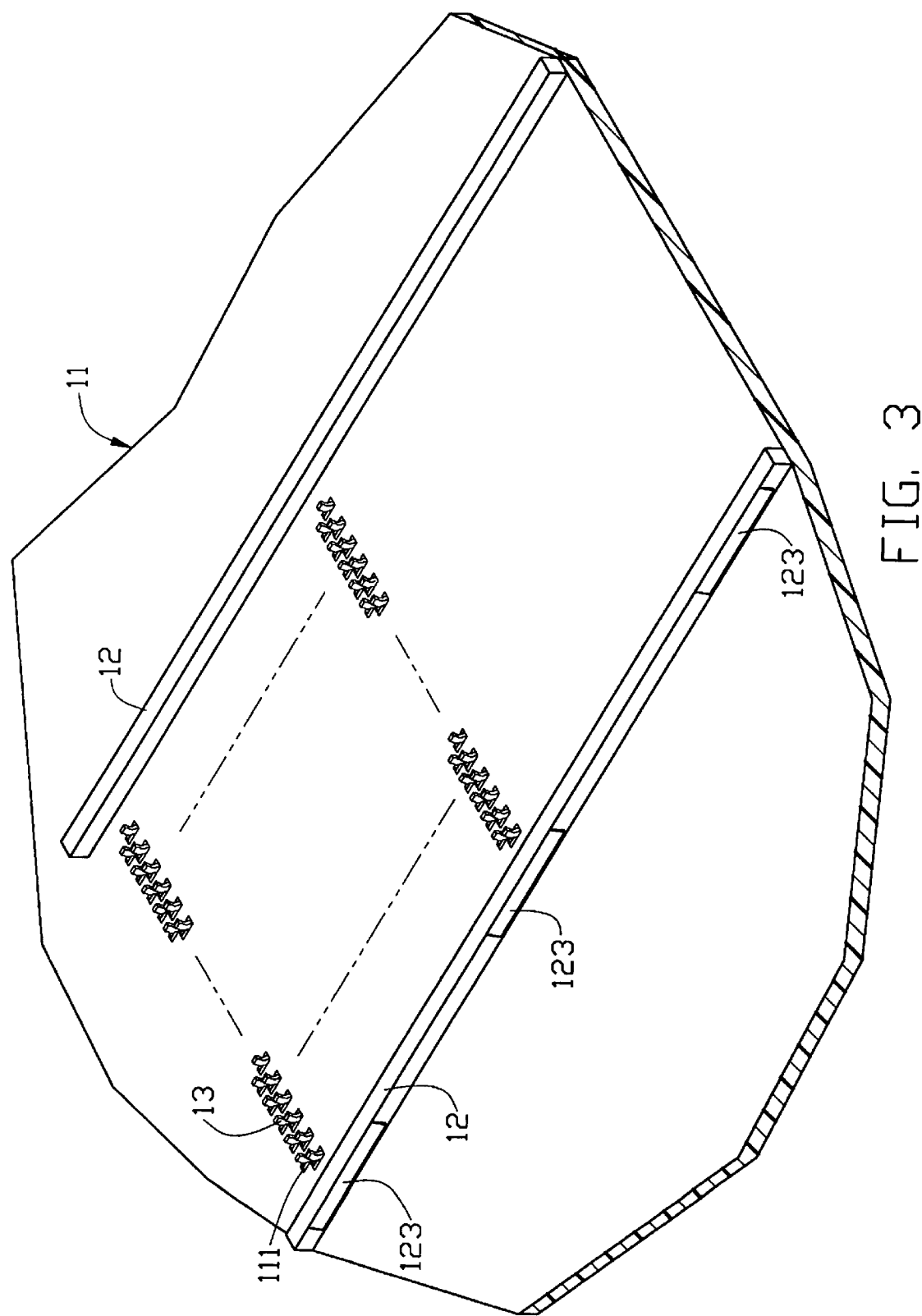
FIG. 3 is a perspective view of two locking blocks of the socket connector of the present invention mounted on a circuit board.

Also referring to FIG. 3, a plurality of conductive contact elements 13 is received and retained in slots 111 defined in the circuit board 11 between the locking blocks 12 and electrically connected to the circuit board 11. The contact elements 13 extend beyond a top face 110 of the circuit board 11, preferably with free top ends thereof substantially flush with top surfaces of the locking blocks 12.

The cover 17 comprises a flat body 170 substantially covering the area of the circuit board 11 between the locking blocks 12, and two flanges 172 extending from opposite edges thereof for snugly fitting over the locking blocks 12. Each flange 172 defines recesses (not shown) on an inside surface thereof for engaging with projections 123 formed on the corresponding locking block 12 thereby securing the cover 17 to the locking blocks 12 and the circuit board 11. A plurality of through holes 171 is defined in the flat body 170 of the cover 17 for receiving pins of the electronic device. The pins partially extend into corresponding slots 151 defined in the slide plate 15. A conductive member 152 (only one shown for simplicity) is fixed in each of the slots 151 of the slide plate 15 whereby when the slide plate 15 is moved to a predetermined position, the conductive member 152 simultaneously engages with the corresponding pin of the electronic device and the corresponding contact element 13 for establishing electrical engagement therebetween.

A manual drive member 16 is pivotally attached to the cover 17 with a hole 161 defined therein rotatably receiving a pin (not shown) formed on the cover 17. The manual drive member 16 is drivingly coupled to the slide plate 15 for moving the slide plate 15 with respect to the cover 17 and the circuit board 11. The manual drive member 16 partially extends beyond the cover 17 for facilitating manual operation to move the slide plate 15 to the predetermined position.

Figure 5:
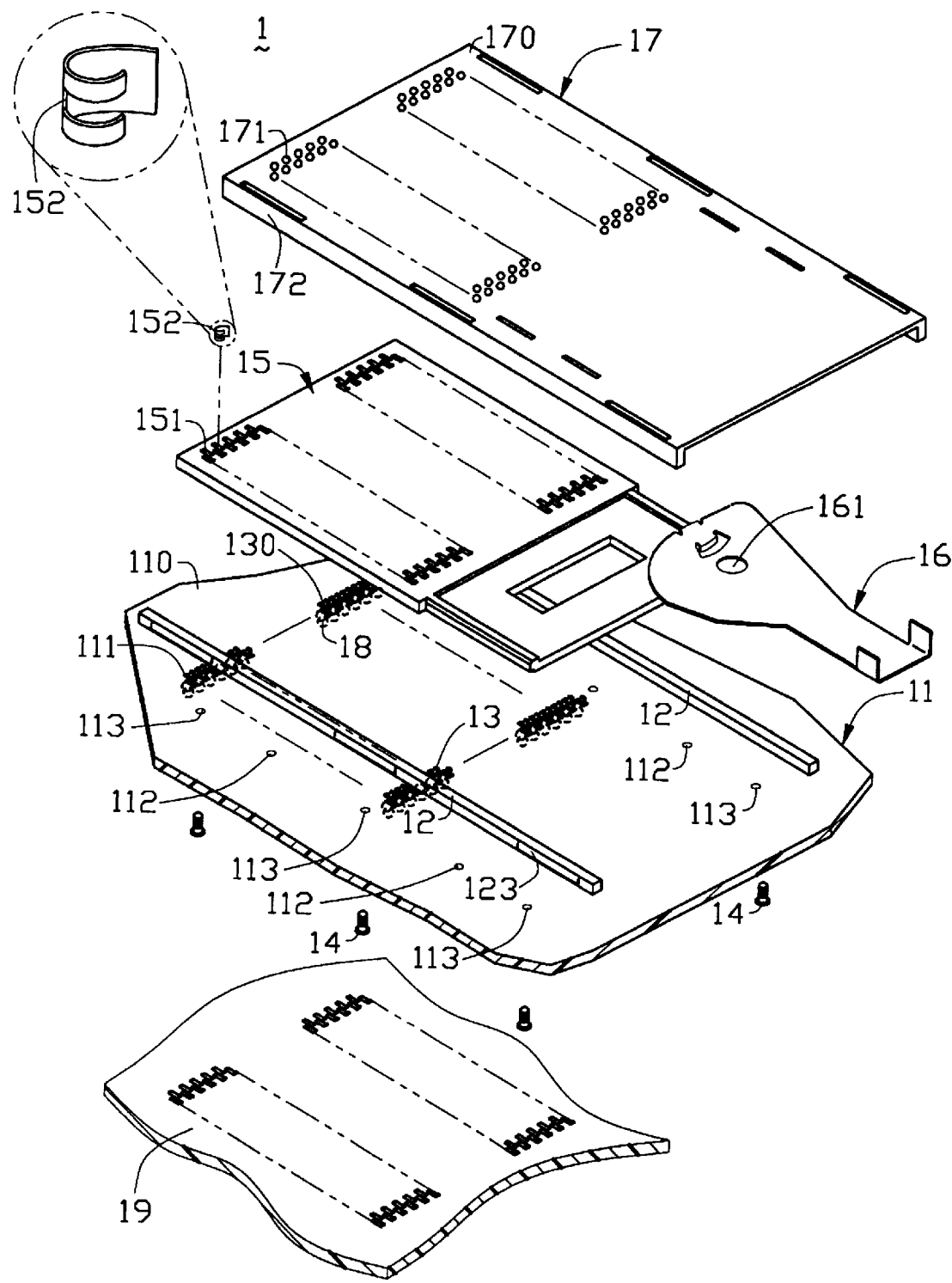
FIG. 5 is an explode view of a socket connector in accordance with the present invention to be mounted on a circuit board and a primary circuit board.

The socket connector 1 of the present invention eliminates the base required by the prior art by directly fixing the cover 17 to the circuit board 11 by means of two locking blocks 12. This not only overcomes the thermal expansion problem, but also visually exposes the contact elements 13 for inspection purposes. Furthermore, manufacturing costs of the socket connector are reduced due to the reduced amount of required material and the simplification of the overall structure thereof. Understandably, as is shown in FIG. 5 the circuit board 11 may alternatively be further positionably solderable mounted to a primary circuit board 19 via solder balls 18 which are positioned under the circuit board 11 and electrically connected to the corresponding contact elements 13 and the corresponding circuit traces on the primary board 19, respectively. Under this situation, the solder balls 18 will not be cracked due to temperature change because the circuit board 11 owns the same thermal expansion coefficient as the primary circuit board 19 thereunder.

Although the present invention has been described with reference to the preferred embodiment, it is apparent to those skilled in the art that a variety of modifications and changes may be made without departing from the scope of the present invention which is intended to be defined by the appended claims.

What is claimed is:

1. An electrical connector for electrically connecting an electronic device to a circuit board comprising:
    a plurality of contact elements fixed to and electrically connected with the circuit board;
    a cover attached to and spaced from the circuit board for covering the contact elements, the cover defining a plurality of holes corresponding to the contact elements for receiving pins of the electronic device; and
    a slide plate received between the cover and the circuit board and movable with respect to the cover and the circuit board, the slide plate defining a plurality of slots corresponding to the contact elements, each slot partially receiving the corresponding contact element and the corresponding pin of the electronic device to establish electrical engagement therebetween when the slide plate is moved to a predetermined position,
    two spaced locking blocks fixed to the circuit board, wherein the cover comprises two flanges snugly fit over the locking blocks, means being provided between the locking blocks and the corresponding flanges of the cover to fix the cover to the locking blocks,
    wherein the contact elements are soldered to the circuit board,
    wherein the means for fixing the cover to the locking blocks comprises projections formed on each locking block for engaging with recesses defined in the corresponding flange of the cover,
    wherein each locking block defines at least one innerthreaded securing hole, and wherein a through hole is defined in the circuit board for receiving a fastener which a threaded section engages with the securing hole of the locking block thereby fixing the locking block to the circuit board.

2. The electrical connector as claimed in claim 1, wherein the fastener is made of an insulative material.

3. The electrical connector as claimed in claim 2, wherein the fastener is made of plastic.

4. The electrical connector as claimed in claim 1, wherein each locking block comprises at least one positioning pin received in a corresponding hole defined in the circuit board for properly positioning the locking block on the circuit board.

5. The electrical connector as claimed in claim 4, wherein each locking block has two positioning pins and three securing holes alternately arranged with each other.

6. The electrical connector as claimed in claim 1, wherein the contact elements are arranged between the locking blocks.

7. The electrical connector as claimed in claim 1 further comprising a manual drive member pivotally attached to the cover and drivingly coupled to the slide plate, the manual drive member partially extending beyond the cover for facilitating manual operation to move the slide plate.

8. The electrical connector as claimed in claim 1, wherein a conductive member is fixed in each of the slots of the slide member for simultaneously engaging with the corresponding contact element and the corresponding pin of the electronic device thereby establishing electrical engagement therebetween when the slide plate is moved to the predetermined position.

9. An electrical connector assembly for electrically connecting an electronic device to a primary circuit board, comprising:
    a circuit board having the same thermal expansion coefficient with the primary circuit board and mechanically and electrically connected to the primary circuit board via solder balls thereunder;
    a plurality of contact elements fixed to the circuit board and electrically connected to the corresponding solder balls, respectively;
    a pair of locking blocks securely positioned on the circuit board;
    a cover securely attached to said pair of locking blocks and spaced from the circuit board for covering the contact elements, the cover defining a plurality of holes corresponding to the contact elements for receiving pins of the electronic device; and
    a slide plate moveably received between the cover and the circuit board, the slide plate defining means for establishing respective electrical engagement between the contacts and the corresponding pins when the slide plate is moved to a predetermined position.

* * * * *